United States Patent [19]

Unger et al.

[11] Patent Number: 4,947,105
[45] Date of Patent: Aug. 7, 1990

[54] METHOD AND CIRCUIT FOR TESTING INTEGRATED CIRCUIT MODULES

[75] Inventors: Bernhard Unger; Rainer Rauschert, Munich, both of Fed. Rep. of Germany

[73] Assignee: Siemens Aktiengesellschaft, Berlin and Munich, Fed. Rep. of Germany

[21] Appl. No.: 307,198

[22] Filed: Feb. 3, 1989

Related U.S. Application Data

[63] Continuation of Ser. No. 936,754, Dec. 2, 1986, abandoned.

[30] Foreign Application Priority Data

Dec. 3, 1985 [DE] Fed. Rep. of Germany ....... 3542731

[51] Int. Cl.$^5$ .................. G01R 31/28; H03K 3/02
[52] U.S. Cl. .................. 324/158 R; 307/362; 307/494; 371/28
[58] Field of Search .......... 324/73 R, 73 AT; 307/455, 354, 362, 494; 371/15, 28, 48

[56] References Cited

U.S. PATENT DOCUMENTS

| | | | |
|---|---|---|---|
| 3,577,073 | 5/1971 | Cray | 324/73 R |
| 3,820,077 | 6/1974 | Giebler et al. | 371/28 X |
| 4,359,653 | 11/1982 | Takamasa | 307/475 X |
| 4,553,225 | 11/1985 | Ohe | 324/158 T X |
| 4,575,647 | 3/1986 | Ashton et al. | 307/443 |
| 4,672,237 | 6/1987 | Kiyozuka | 307/455 X |

FOREIGN PATENT DOCUMENTS

| | | |
|---|---|---|
| 3040733 | 5/1982 | Fed. Rep. of Germany . |
| 2849153 | 8/1982 | Fed. Rep. of Germany . |
| 77150 | 7/1978 | Japan ............... 324/73 R |

OTHER PUBLICATIONS

"Precise Bias Drivers for High-Speed Logic and Memory Circuits", Schön K. et al., ESSCIRC, Aug. 22-24, 1981, pp. 205-207.

Millman, J., "Microelectronics", copyright 1987, McGraw-Hill, Inc., pp. 251-261.

*Primary Examiner*—Jerry Smith
*Assistant Examiner*—Stephen M. Baker
*Attorney, Agent, or Firm*—Hill, Van Santen, Steadman & Simpson

[57] ABSTRACT

A method and circuit for identifying hidden faults in the internal circuit parts of integrated CML-logic-circuits include reducing the voltage difference between the high and low binary signals (logic swing) during testing so that the noise immunity is diminished. The logic swing is reduced by varying reference voltages for constant current sources and differential amplifiers through the use of an integrated control circuit connected to influence reference voltage generators. The control circuit is activated by reducing the supply voltage in a first embodiment or, in a second embodiment, by an external control signal.

2 Claims, 2 Drawing Sheets

METHOD AND CIRCUIT FOR TESTING INTEGRATED CIRCUIT MODULES

This is a continuation of application Ser. No. 936,754 filed Dec. 2, 1986, now abandoned.

BACKGROUND OF THE INVENTION

1. Field of the Invention

The present invention relates to a method for detecting even hidden faults within integrated circuit modules by reducing the internal noise margin and to a circuit arrangement for accomplishing same.

2. Description of the Prior Art

In large scale integrated (LSI) circuit modules, there is no direct external access to internal circuit parts, such as for testing. While functional checking of the circuitry is possible, it is generally not possible to perform noise immunity testing of the internal circuit parts. As such, internal circuit parts which have a diminished noise immunity due to technological deficiencies are not discovered by circuit testing since the tests cannot be carried out under the sort of "worst case" conditions which can occur during use of the circuit.

German Patent No. OS 30 40 733 discloses a method for investigating integrated circuits which includes exposing portions of the circuit which generally have a low noise immunity to the influence of alpha radiation so as to further reduce the noise immunity. The resulting misbehavior, or malfunction, of the circuit is observed. The disclosed method is especially useful for memory circuit modules. It is, however, rather involved and, therefore, useful only during the development phase of circuit production. For example, it is used to investigate the initial production run of a circuit type.

Reference voltage generators as found in integrated circuits are known, for example, from Tagungsbericht ESSCIRC, 22-24 Sept. 1981, pp. 205-207, and from German Patent No. 28 49 153.

SUMMARY OF THE PRESENT INVENTION

An object of the present invention is to discover whether hidden faults are present within internal circuit parts of an integrated circuit module and to provide for such fault identification on a high volume scale.

This and other objects of the present invention are achieved in a method and a circuit arrangement for implementing the method. The present method provides for reducing the noise margin of the circuit to be tested by reducing the difference between the high and low binary signal levels of the internal integrated circuits. The binary signal, or logic, level difference is reduced by controlling one or more reference voltage generators provided internally in the integrated circuit.

A control circuit is provided for connection to the reference voltage generators to carry out the present method, the control circuit including a pair of transistors connected to a first constant current source, a base of, the first transistor being connected to a reference voltage. A second constant current source and a resistor are connected to the input of the second transistor and are sized to enable the second transistor to assume a current conducting state during normal supply voltages and a current blocking state during reduced supply voltages. It is possible through the use of such circuit to reduce the logic swing of the internal circuits by reducing the supply voltage and thus to identify internal circuit faults within an integrated circuit.

DESCRIPTION OF THE PREFERRED EMBODIMENTS

A method of the present invention wherein hidden faults are identified within integrated circuit modules formed in current-mode logic circuit technology can be used during the development phase of integrated circuit manufacturing for detecting errors and weaknesses therein. For example, circuit faults which arise as a consequence of disadvantageous transmission line or power busses management or from disadvantageous circuit design can be identified. The present method, however, is especially intended for use in testing of integrated circuits and, for example, in incoming inspection of circuits to find those circuit modules which appear faultless during static tests under normal operating conditions, but which nonetheless have various hidden faults due to technological deficiencies. Such hidden faults can be recognized by reducing the noise margin of the internal circuit, which is proportional to diminishing the logic swing of internal binary levels.

Figure 1:
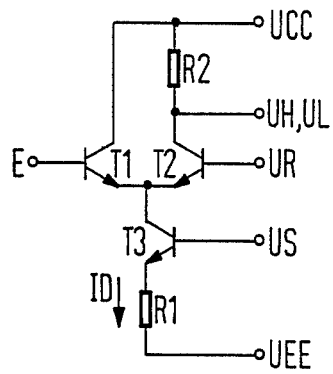
FIG. 1 is a circuit diagram of a basic current-mode logic circuit.

To more clearly understand the concepts behind the present method, a basic circuit arrangement for an integrated circuit is shown in FIG. 1, the circuit being formed in current-mode logic (CML) circuit technology and preferably in emitter-coupled logic (ECL) circuit technology. The basic circuit arrangement contains a differential amplifier having two transistors T1 and T2 whose emitters are connected together. The differential amplifier is operated with a constant current ID that is supplied by a current source. The current source is formed of a transistor T3 and a resistor R1 connected to an emitter of the transistor T3. A base of the current source transistor T3 lies at a reference voltage US. In the following, the reference voltage US is referred to as a current source reference.

The base of the transistor T1 of the differential amplifier is the signal input E for receiving binary input signals. The base of the second transistor T2 is maintained at a second reference voltage UR. The reference voltage UR corresponds to the mean value of upper and lower binary signal levels of the binary input signal at input E. In the following, the reference voltage UR is also referred to as a current switch reference.

The circuit arrangement of FIG. 1 is supplied with a supply voltage across terminal points UCC and UEE. The voltage at the terminal point UCC, which lies at the collector side of the differential amplifier, serves as a reference potential. The other voltages, and in particular, the current switch reference UR and binary signal output levels UH and UL which are the upper and lower levels of the output signal, are referenced to the potential UCC. The reference potential UCC also serves as a reference for additional current switch reference levels when two and three levels of series gating circuits are utilized. The current source reference US is an exception in that it is not referenced to UCC. The voltage difference of the current source reference US and the terminal point UEE, which lies at the emitter side of the differential amplifier, defines together with the value of the current supplied by the current source the value of the emitter resistor R1.

The output signal of the illustrated circuit can have, alternately, the binary signal levels UH and UL and is not inverted with respect to the input signal at input E. Since the output signal is taken at the collector of the transistor T2, a load resistor R2 is provided only for the second transistor T2. The collector of the transistor T1 is directly connected to the reference potential point UCC.

In operation, the circuit of FIG. 1 has the high binary signal level UH at the output when the transistor T2 at whose collector the output signal is taken is currentless. If it is assumed that the output load is zero, (its influence usually being slight), then the upper signal level UH corresponds to the reference potential UCC and is invariable due to measures that are intended to take effect only during testing. The lower signal level UL is a result of the voltage drop across the collector resistor R2 as a result of the current ID supplied by the current source. The difference between the signals UH and UL is the logic swing $\Delta U$.

According to the present invention, the logic swing $\Delta U$ is reduced by raising the lower signal level UL by an amount 2dU. Raising of the lower signal level UL is achieved by lowering the current source reference US to diminish the base bias for the current source transistor T3 to reduce the differential amplifier current ID and correspondingly the voltage drop across the collector load resistor R2 of the conductive transistor T2 in the differential amplifier.

The desired result of the present invention is not produced solely by one-sided reduction of the noise immunity as just set forth. In addition, it is necessary that the current switch reference UR be raised, such as by an amount dU, so that it again corresponds to the mean value of the upper signal level UH and the modified lower signal level UL.

Figure 2:
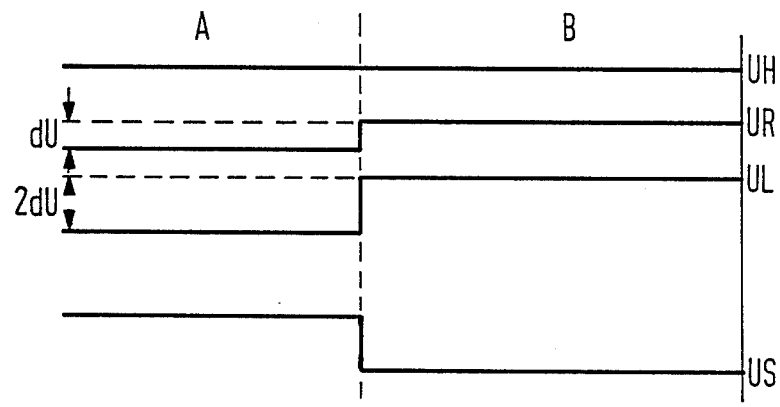
FIG. 2 is a graph showing signal levels and reference potentials for a current-mode logic circuit during normal operating mode and during test mode.

Referring to FIG. 2, the various voltages of the circuit of FIG. 1 are shown. The voltages for normal operating conditions are shown at the portion A while the voltages occurring during the test conditions are shown at the portion B. In particular, the upper signal level UH remains unchanged during both normal and test conditions. As can be seen, the current source reference US is lowered, causing the lower signal level UL to increase by an amount 2dU. The current switch reference UR is correspondingly raised by an amount dU so as to maintain its position midway between the upper signal level UH and the lower signal level UL.

Reference voltage generators, also known as bias drivers, are commonly provided in integrated circuit arrangements for generating the current source reference signals US and the current switch reference levels UR. The known reference voltage generators are generally temperature compensated and are independent within wide limits of changes in supply voltage.

For purposes of the present method, the reference potentials US and UR must be designationally variable.

Such variation is achieved by separating an internal feedback in known reference voltage generators and by feeding in a variable auxiliary voltage to the circuit. The internal feedback of the circuit disclosed in German Patent No. 28 49 153, for example, is at the base terminal of the transistor T3 shown therein.

Figure 3:
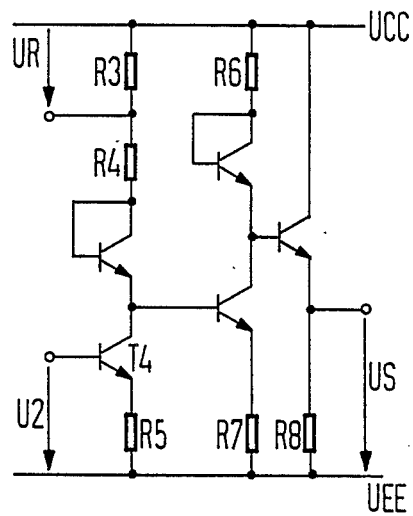
FIG. 3 is a circuit diagram of a controllable reference voltage generator.

With reference to FIG. 3, a modified reference voltage generator is shown for an integrated circuit. The circuit of FIG. 3 generates the reference voltages required by a circuit such as that shown in FIG. 1. Assuming that the value of resistor R6 and resistor R7 are equal, and that the sum of the values of resistor R3 and resistor R4 is equivalent to the resistance value of the resistor R8, the reference voltages UR and US are proportional to an auxiliary voltage U2 which exists between the base of a transistor T4 and terminal UEE of the supply voltage, the voltage U2 being reduced by a voltage drop UBE across the base and emitter terminals of the transistor T4 when the transistor T4 is conducting. In detail, the following are true:

$$UR = (U2 - UBE) \cdot \frac{R3}{R5} \text{ and}$$

$$US = (U2 - UBE) \cdot \frac{R8}{R5}$$

Figure 4:
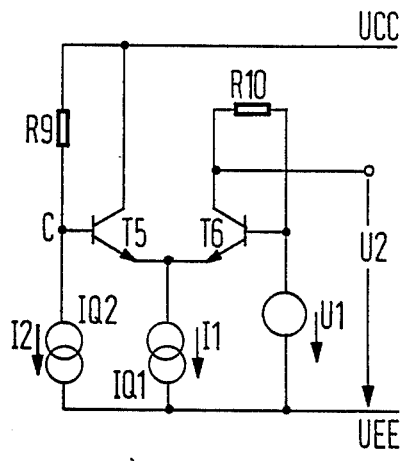
FIG. 4 is a circuit diagram of a control circuit for intentional reduction of circuit noise immunity according to the principles of the present invention.

In FIG. 4 is shown an integrated control circuit for controlling the reference voltage generator of FIG. 3 by producing an auxiliary voltage U2 which can be set to two different levels. The control of FIG. 4 includes two transistors T5 and T6 whose emitters are connected to one another and to a current source circuit IQ1 which supplies a current I1. The collector of the transistor T5 is connected to a reference voltage UCC which is set at zero volts. The base of the transistor T5 is connected at a node C with a resistor R9 and a second current source IQ2. The resistor R9 is connected at its other end to the reference potential UCC, and the second current source circuit IQ2, which generates a current I2, is connected at its opposite end to a terminal point UEE.

A second transistor T6, which together with the first transistor T5 forms a differential amplifier, has its base connected to a constant bias voltage source U1 relative to the pole UEE of the supply voltage at the emitter side of the amplifier pair. The bias voltage U1 is supplied by a fully voltage-compensated and temperature-compensated reference voltage generator. The reference voltages for the current sources IQ1 and IQ2 are also derived from the reference voltage generator. A resistor R10 is connected between the base and the collector of the transistor T6, while the output or auxiliary voltage U2 is taken at the collector of the transistor T6.

The control circuit of FIG. 4 is designed so that it activates when the supply voltage between the terminal points UCC and UEE is reduced. The supply voltage between the two terminal points UCC and UEE are hereinafter referred to as supply voltage UEE since the terminal point UCC is allocated as a reference potential. By adjusting the voltage drop across the resistor R9 in the right manner, then the $$|UEE| - I2 \cdot R9 > U1$$

is true, for nominal values of supply voltage UEE, where UEE is in the range of operation $$|UEE1| \geq |UEE| \geq |UEE2|.$$

The transistor T5, thus, carries the current I1 and the transistor T6 is currentless, with the result that U2=U1.

During the test mode, the supply voltage UEE is reduced by a value UEEP so that the following condition applies:

$$|UEEP| - I2 \cdot R9 < U1.$$

The current I1 then flows through the transistor T6 so that $$U2 = U1 - I1 \cdot R10 < U1.$$

When the control circuit of FIG. 4 is connected so that the voltages are applied to the reference voltage generator shown in FIG. 3, the voltages UR and US are changed. In other words, an increase of the current switch reference UR and a reduction of the current source reference US relative to UEE is accomplished.

Figure 5:
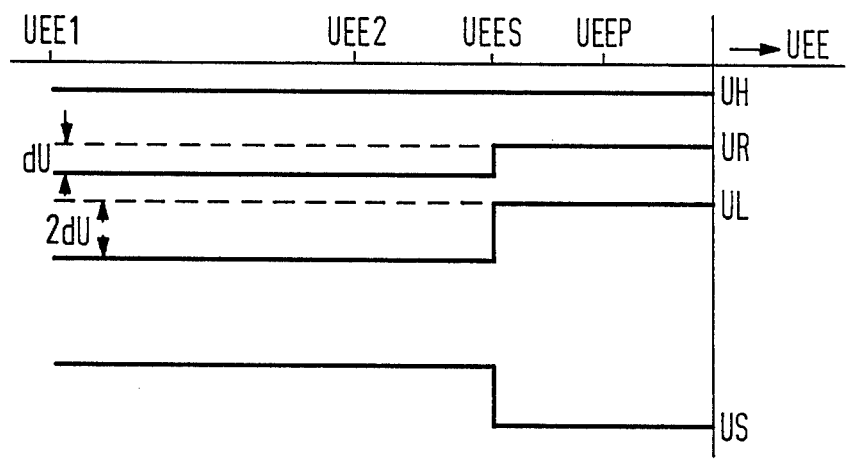
FIG. 5 is a graph showing signal levels and reference potentials for a circuit as a function of supply voltages.

In FIG. 5, the diagram shows the influence of changes in the supply voltage UEE on the signal levels and reference levels for a CML circuit. Except for a narrow range around value UEES, the voltage UR and US are both constant within the normal operating range, as defined by UEE1 and UEE2, and the testing range denoted UEEP.

For the supply voltage UEEP set during the test, the output stages used in LSI circuit modules need only be functional to such a degree that externally output signal levels are clearly definable. The only check being carried out in the present method is for internal functionability and not to observe defined parameters. Care must be used in selecting the test supply voltage UEEP so that the transistors of the circuit arrangement being tested do not go to saturation, which simulates fault conditions.

A control circuit of the present invention could be modified slightly in comparison to the control circuit of FIG. 4 so that increasing instead of reducing the supply voltage UEE would activate it. Since, however, this would result in an increase of power dissipation, such modification is not preferred.

Figure 6:
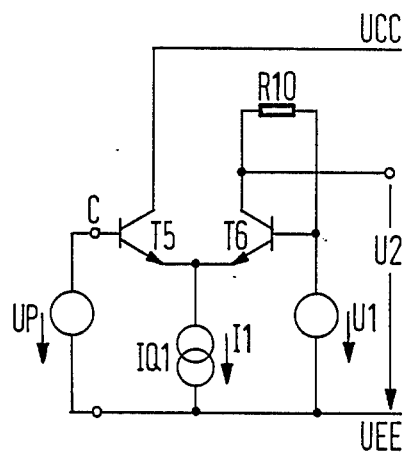
FIG. 6 is a circuit diagram of a second embodiment of a control circuit according to the present invention.

Undesired effects can be avoided during testing of integrated circuit modules by activating the control circuit of the invention by an externally supplied control voltage UP, instead of by the modified supply voltage UEE. A modified control circuit, which is shown in FIG. 6, eliminates the resistor R9 and the current source IQ2 and instead provides a control voltage UP applied between the terminal point UEE and the point C at the base of the transistor T5. Thus, the control voltage UP is set greater than U1 during normal operation and UP is set at less than U1 during the test mode. Both the control circuit of FIG. 4 and the control circuit of FIG. 6 are preferably provided internally of an integrated circuit so that testing is accomplished simply by causing the control circuit to assume the test mode.

While the method with the circuit of FIG. 6 offers the advantage of operation at normal supply voltages, a disadvantage is present in that at least one additional terminal pin and a few additional internal lines to conduct the control voltage UP to the control circuits are required.

Although other modifications and changes may be may suggested by those skilled in the art, it is the intention of the inventors to embody within the patent warranted hereon all changes and modifications as reasonably and properly come within the scope of their contribution to the art.

We claim as our invention:

1. A control circuit for an integrated CML-logic-circuit to detect faults in internal circuit parts by reduction of noise immunity by controlling a reference voltage generator, activating the control circuit by varying the supply voltage, comprising:
    first and second transistors having emitters connected together;
    a first constant current source for supplying a first current connected to said connected emitters of said first and second transistors;
    first and second terminal points for a supply voltage, said first terminal point being at an emitter side of said first and second transistors;
    means for supplying a constant bias voltage to a base of said first transistor, said bias voltage being constant in comparison to the supply voltage at said first terminal point;
    a first resistor connected directly between the base of said first transistor and a collector of said first transistor;
    said collector of said first transistor for connection to the reference voltage generator to supply an output voltage;
    a second resistor connected at a first end to a base of said second transistor;
    a second constant current source for generating a second current connected at said first end of said second resistor;
    said second resistor and said second constant current source connected in series across said first and second terminal points, said second constant current source being connected at one side to said first terminal point, said second current and said second resistor having electrical characteristics of such dimensions to cause said second transistor to assume a current conducting state for a normal supply voltage and to assume a currentless state for supply voltages reduced from the normal supply voltage.

2. A control circuit for an integrated CML-logic-circuit for identifying faults in internal circuit parts by reduction of noise immunity by controlling a reference voltage generator, activating the control circuit by an external signal, comprising:
    first and second transistors having emitters connected to one another;
    a first constant current source connected to the connected emitters of said first and second transistors for supplying a first current;
    first and second terminal points for a supply voltage, said first terminal point being at an emitter side of said first and second transistors
    means for supplying constant bias to a base of said first transistor, said constant bias being constant relative to the supply voltage at said first terminal point;
    a resistor connected directly between the base of said first transistor and a collector of said first transistor to generate an output voltage for connection to a reference voltage generator;
    means for applying an external control signal applied between a base of said second transistor and said first terminal point of said supply voltage at the emitter side of said first and second transistors.

* * * * *